US011113220B2

United States Patent
Ngo et al.

(10) Patent No.: US 11,113,220 B2
(45) Date of Patent: Sep. 7, 2021

(54) SINGLE-WIRE PEER-TO-PEER BUS (71) Applicant: Qorvo US, Inc., Greensboro, NC (US)

(72) Inventors: Christopher Truong Ngo, Queen Creek, AZ (US); Nadim Khlat, Cugnaux (FR); Alexander Wayne Hietala, Phoenix, AZ (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/675,335

(22) Filed: Nov. 6, 2019

(65) Prior Publication Data
US 2020/0364168 A1 Nov. 19, 2020

Related U.S. Application Data (60) Provisional application No. 62/847,609, filed on May 14, 2019.

(51) Int. Cl.
*G06F 13/376* (2006.01)
*H04L 29/08* (2006.01)
(Continued)

(52) U.S. Cl.
CPC ......... *G06F 13/376* (2013.01); *H03F 1/0277* (2013.01); *H03F 1/30* (2013.01); *H03F 3/211* (2013.01); *H04L 12/40006* (2013.01); *H04L 67/1046* (2013.01); *H04L 67/1051* (2013.01); *H03F 2200/102* (2013.01); *H03F 2200/451* (2013.01)

(58) Field of Classification Search
CPC .............. G06F 13/376; H04L 67/1046; H04L 67/1051

USPC .......................................................... 710/110
See application file for complete search history.

(56) References Cited

U.S. PATENT DOCUMENTS 5,046,065 A * 9/1991 Goertz ................... G08C 15/00
370/402
5,946,471 A * 8/1999 Voorhees ........... G01R 19/2516
703/23

(Continued)

OTHER PUBLICATIONS

CAN Specification Version 2.0 (Year: 1991).*
(Continued)

*Primary Examiner* — Paul R. Myers
(74) *Attorney, Agent, or Firm* — Withrow & Terranova, PLLC (57) ABSTRACT A single-wire peer-to-peer (P2P) bus apparatus is provided. The single-wire P2P bus apparatus includes a first peer device and a second peer device(s) coupled to a single-wire bus that correspond to a first bus access priority and a second bus access priority(s), respectively. Any of the first peer device and the second peer device(s) can contend for access to the single-wire bus by asserting a bus contention indication(s) when the single-wire bus is in a defined bus state. A winner for the single-wire bus may be a peer device having a highest bus access priority among those peer devices asserting the bus contention indication(s). In this regard, any peer device on the single-wire bus can have a chance to initiate communications over the single-wire bus, thus making it possible for the single-wire bus to function based on bidirectional P2P bus architecture capable of supporting more application and/or deployment scenarios.

19 Claims, 6 Drawing Sheets (51) Int. Cl.
  *H03F 1/02*  (2006.01)
  *H03F 1/30*  (2006.01)
  *H03F 3/21*  (2006.01)
  *H04L 12/40*  (2006.01)

(56) References Cited

U.S. PATENT DOCUMENTS

| | | | |
|---|---|---|---|
| 6,484,082 B1* | 11/2002 | Millsap | H04L 12/4035 |
| | | | 701/32.7 |
| 6,532,506 B1* | 3/2003 | Dunstan | G06F 13/4295 |
| | | | 326/86 |
| 7,095,250 B1* | 8/2006 | Stolitzka | G06F 13/4077 |
| | | | 326/27 |
| 9,270,230 B2 | 2/2016 | Henshaw et al. | |
| 9,471,795 B2* | 10/2016 | Jayaraman | G06F 21/629 |
| 10,090,808 B1 | 10/2018 | Henzler et al. | |
| 10,298,187 B2 | 5/2019 | Goldblatt | |
| 10,528,503 B1* | 1/2020 | Mishra | G06F 13/1605 |
| 2014/0376599 A1* | 12/2014 | Xi | H04L 12/4135 |
| | | | 375/211 |
| 2015/0237174 A1* | 8/2015 | Brochi | H04L 12/6418 |
| | | | 370/474 |
| 2016/0164400 A1* | 6/2016 | Rinne | H02M 3/04 |
| | | | 323/234 |
| 2017/0199832 A1 | 7/2017 | Mishra et al. | |
| 2018/0336149 A1* | 11/2018 | Petersen | G06F 13/362 |
| 2019/0097584 A1 | 3/2019 | Du | |
| 2019/0155781 A1 | 5/2019 | Amarilio et al. | |
| 2019/0185057 A1 | 6/2019 | Lowery, Jr. et al. | |
| 2019/0245872 A1* | 8/2019 | Shin | H04L 63/1425 |
| 2019/0356279 A1 | 11/2019 | Korol et al. | |
| 2019/0385057 A1* | 12/2019 | Litichever | H04L 63/1416 |
| 2020/0213351 A1* | 7/2020 | Shin | G06F 21/554 |

OTHER PUBLICATIONS

CAN with Flexible Data-Rate Specification Version 1.0 Apr. 17, 2012 (Year: 2012).*

Author Unknown, "Specification for RF Front-End Control Interface (RFFE)," MIPI Alliance Inc., Version 2.1, Dec. 18, 2017, 230 pages.

Non-Final Office Action for U.S. Appl. No. 16/675,366, dated Jun. 9, 2021, 6 pages.

* cited by examiner

SINGLE-WIRE PEER-TO-PEER BUS

RELATED APPLICATIONS

This application claims the benefit of U.S. provisional patent application Ser. No. 62/847,609, filed on May 14, 2019, the disclosure of which is incorporated herein by reference in its entirety.

This application is related to concurrently filed U.S. patent application Ser. No. 16/675,366, now U.S. Patent Application Publication No. 2020/0366248 A1, entitled "ENVELOPE TRACKING AMPLIFIER APPARATUS INCORPORATING SINGLE-WIRE PEER-TO-PEER BUS," the disclosure of which is hereby incorporated herein by reference in its entirety.

FIELD OF THE DISCLOSURE

The technology of the disclosure relates generally to a peer-to-peer (P2P) communication bus.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, a mobile communication device may employ a power amplifier(s) to amplify a radio frequency (RF) signal(s) to a higher output power prior to radiating the RF signal via an antenna(s).

However, the increased output power of RF signal(s) can lead to increased power consumption and thermal dissipation, thus compromising overall performance and user experiences. Envelope tracking (ET) is a power management technology designed to improve efficiency levels of PAs to help reduce power consumption and thermal dissipation in mobile communication devices. As such, it may be desirable to enable ET in mobile communication devices whenever possible. Notably, the RF signal(s) communicated in different wireless communication systems may correspond to different modulation bandwidths (e.g., from 80 KHz to over 200 MHz). As such, it may be further desirable to ensure that the power amplifier(s) can maintain optimal efficiency across a wide range of modulation bandwidth.

In many mobile communication devices, the power amplifier(s) and the antenna(s) are typically located in an RF front-end (RFFE) circuit communicatively coupled to a transceiver circuit(s) via an RFFE bus as defined in the MIPI® alliance specification for radio frequency front-end control interface, version 2.1. However, not all communications require a two-wire serial bus like the RFFE bus. In some cases, a single-wire serial bus may be sufficient or even desired for carrying out certain type of communications between circuits. As such, it may be possible to provide a single-wire bus, either concurrent to or independent of, the RFFE bus in a mobile communication device.

SUMMARY

Aspects disclosed in the detailed description include a single-wire peer-to-peer (P2P) bus apparatus. The single-wire P2P bus apparatus includes a first peer device and a second peer device(s) coupled to a single-wire bus that correspond to a first bus access priority and a second bus access priority(s), respectively. In examples discussed herein, any of the first peer device and the second peer device(s) can contend for access to the single-wire bus by asserting a bus contention indication(s) (either concurrently or independently) when the single-wire bus is in a defined bus state configured to permit bus contention. In a non-limiting example, a winner for the single-wire bus is a peer device having a highest bus access priority among those peer devices asserting the bus contention indication(s). In this regard, any peer device on the single-wire bus can have a chance to initiate communications over the single-wire bus, thus making it possible for the single-wire bus to function based on bidirectional P2P bus architecture capable of supporting more application and/or deployment scenarios.

In one aspect, a single-wire P2P bus apparatus is provided. The single-wire P2P bus apparatus includes a first peer device coupled to a single-wire bus and corresponding to a first bus access priority. The single-wire P2P bus apparatus also includes at least one second peer device coupled to the single-wire bus and corresponding to at least one second bus access priority lower than the first bus access priority. At least one selected peer device among the first peer device and the at least one second peer device is configured to assert a bus contention indication when the single-wire bus is in a defined bus state configured to permit bus contention. The at least one selected peer device is also configured to determine whether the bus contention indication is successful based on the first bus access priority and the at least one second bus access priority. The at least one selected peer device is also configured to communicate over the single-wire bus in response to the bus contention indication being successful.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a single-wire peer-to-peer (P2P) bus apparatus. The single-wire P2P bus apparatus includes a first peer device and a second peer device(s) coupled to a single-wire bus that correspond to a first bus access priority and a second bus access priority(s), respectively. In examples discussed herein, any of the first peer device and the second peer device(s) can contend for access to the single-wire bus by asserting a bus contention indication(s) (either concurrently or independently) when the single-wire bus is in a defined bus state configured to permit bus contention. In a non-limiting example, a winner for the single-wire bus is a peer device having a highest bus access priority among those peer devices asserting the bus contention indication(s). In this regard, any peer device on the single-wire bus can have a chance to initiate communications over the single-wire bus, thus making it possible for the single-wire bus to function based on a bidirectional P2P bus architecture capable of supporting more application and/or deployment scenarios.

Figure 1A:
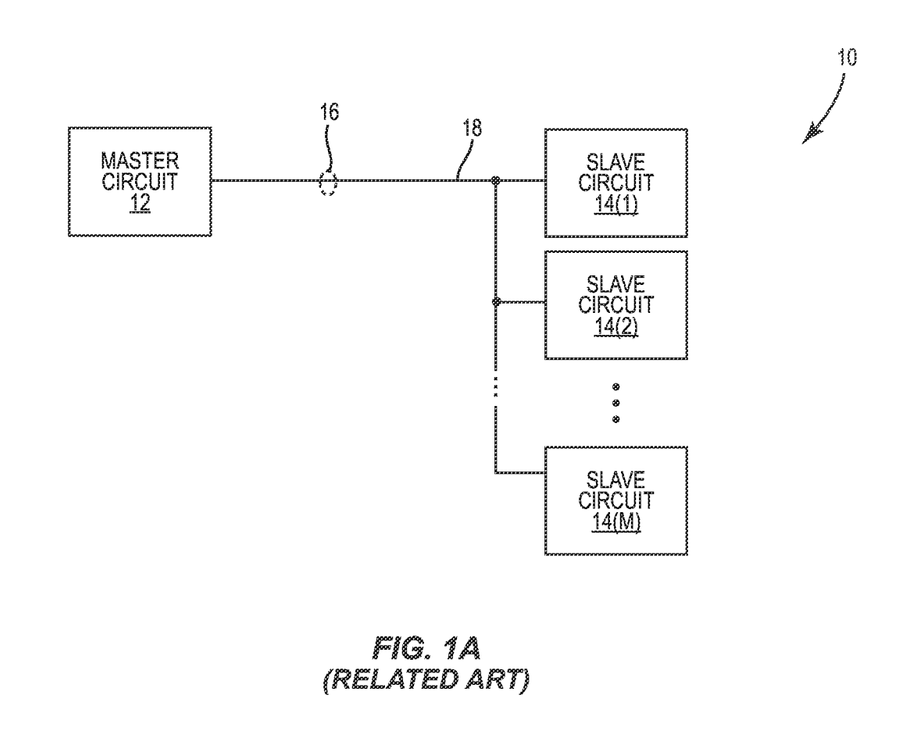
FIG. 1A is a schematic diagram of an exemplary single-wire bus (SuBUS) architecture in which a master circuit is configured to communicate with a slave circuit(s) over a SuBUS having a single wire.
Figure 1B:
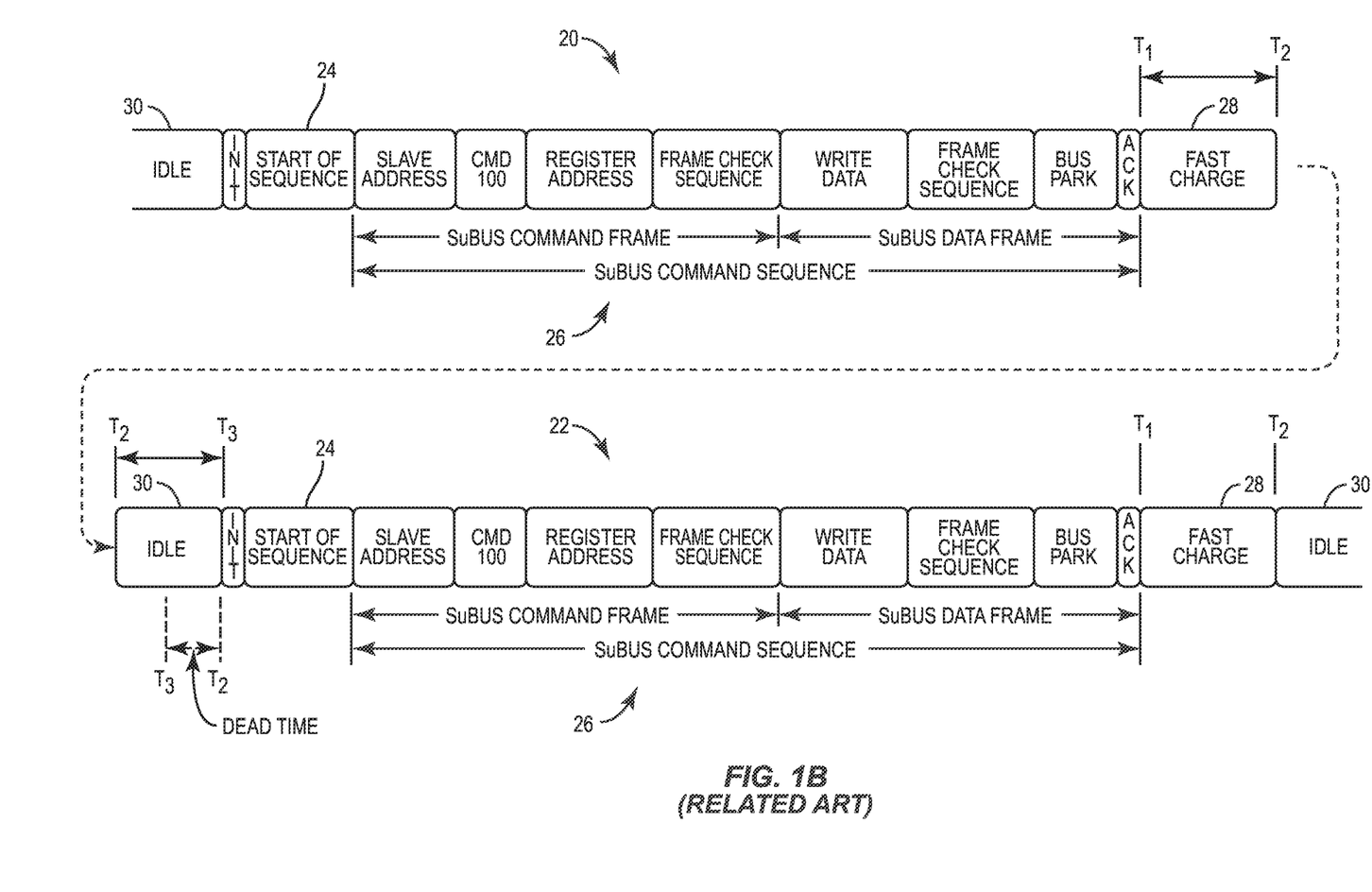
FIG. 1B is a schematic diagram providing an exemplary illustration of one or more SuBUS telegrams communicated over the SuBUS of FIG. 1A.

Before discussing a single-wire P2P bus apparatus of the present disclosure, a brief overview of a conventional single-wire bus (SuBUS) structure is first provided with reference to FIGS. 1A-1B to help understand basic operational principles between a conventional SuBUS master and a conventional SuBUS slave(s). The discussion of specific exemplary aspects of the single-wire P2P bus apparatus of the present disclosure starts below with reference to FIG. 2.

In this regard, FIG. 1A is a schematic diagram of an exemplary conventional SuBUS architecture 10 in which a master circuit 12 is configured to communicate with one or more slave circuits 14(1)-14(M) over a SuBUS 16 consisting of a single wire 18. The master circuit 12 is configured to always initiate a SuBUS telegram communication over the SuBUS 16 by communicating a SuBUS telegram(s). As such, the conventional SuBUS architecture 10 is also known as a "master-slave bus architecture." The slave circuits 14(1)-14(M) may provide a data payload(s) to the master circuit 12 over the SuBUS 16 in response to receiving the SuBUS telegram(s) from the master circuit 12. Hereinafter, when the master circuit 12 and the slave circuits 14(1)-14(M) are communicating the SuBUS telegram(s) and/or the data payload(s) over the SuBUS 16, the master circuit 12 and the slave circuits 14(1)-14(M) are said to be in a bus communication mode.

FIG. 1B is a schematic diagram providing an exemplary illustration of one or more SuBUS telegrams 20, 22 communicated over the SuBUS 16 of FIG. 1A. Each of the SuBUS telegrams 20, 22 includes a start of sequence (SOS) sequence 24 and a SuBUS command sequence 26. The SuBUS command sequence 26 may correspond to a predefined SuBUS operation (e.g., register-read or register-write). The SOS sequence 24 always precedes the SuBUS command sequence 26 and is always communicated from the master circuit 12 to the slave circuits 14(1)-14(M) in FIG. 1A.

The SuBUS telegram 22, which succeeds the SuBUS telegram 20, may be separated from the SuBUS telegram 20 by a fast-charge period 28 that starts at time $T_1$ and ends at time $T_2$ ($T_2 > T_1$) and an idle period 30 that starts at time $T_2$ and ends at time $T_3$ ($T_3 > T_2$). The fast-charge period 28 is configured to allow each of the slave circuits 14(1)-14(M) to draw a higher charging current via the SuBUS 16 and carry out a defined slave operation. In this regard, the SuBUS 16 is said to be in a fast-charge state during the fast-charge period 28. The idle period 30 may be a no-activity period in which the master circuit 12 and the slave circuits 14(1)-14(M) may be inactive to help conserve power. Accordingly, the SuBUS 16 is said to be in an idle state during the idle period 30. During the fast-charge period 28 and the idle period 30, the SuBUS 16 is maintained at a bus voltage $V_{BUS}$ that is greater than zero volts ($V_{BUS} > 0$ V).

The master circuit 12 is configured to suspend the SuBUS telegram communication over the SuBUS 16 during the fast-charge period 28 and the idle period 30. Accordingly, the master circuit 12 and the slave circuits 14(1)-14(M) are configured to refrain from communicating SuBUS telegram(s) and data payload(s) from time $T_1$ to $T_3$. In this regard, the SuBUS 16 can be said to be in a suspension mode between time $T_1$ and $T_3$.

In the conventional SuBUS architecture 10, the SuBUS telegram communication over the SuBUS 16 can only be initiated by the master circuit 12. As such, none of the slave circuits 14(1)-14(M) may initiate the SuBUS telegram communication with the master circuit 12. For example, if any of the slave circuits 14(1)-14(M) has an urgent need to communicate the data payload(s) to the master circuit 12 at time $T_1$, the slave circuit would be forced to wait till at least time $T_3$ to have a chance to access the SuBUS 16, thus hindering the ability of the slave circuit 14(1)-14(M) to fulfill a time-constrained communication need(s). As such, it may be desirable to adapt the conventional SuBUS architecture 10 to allow any of the slave circuits 14(1)-14(M) to initiate a SuBUS telegram and/or a data payload communication(s) with the master circuit 12 over the SuBUS 16.

Figure 2:
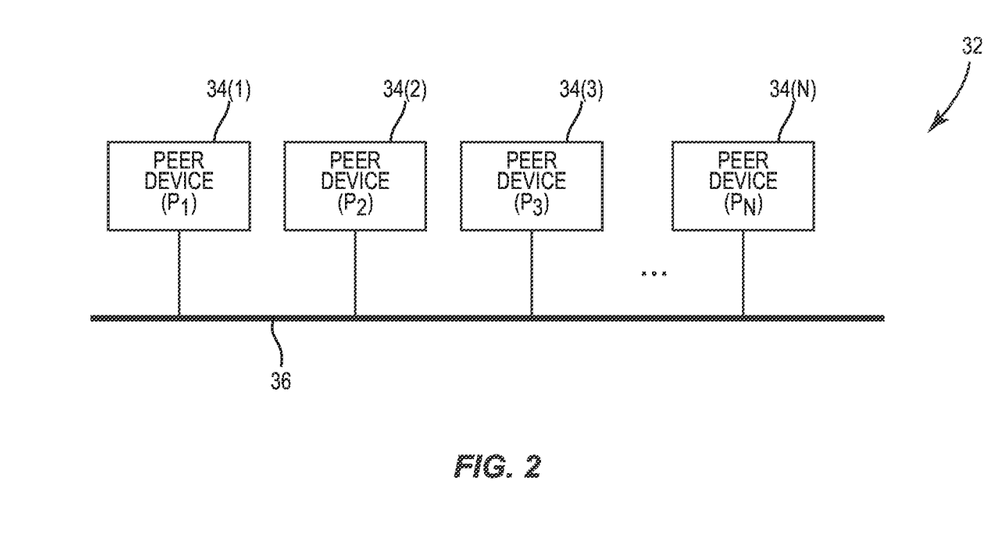
FIG. 2 is a schematic diagram of an exemplary single-wire peer-to-peer (P2P) bus apparatus including a number of peer devices each configured to contend for an opportunity to initiate communication over a single-wire bus.

In this regard, FIG. 2 is a schematic diagram of an exemplary single-wire P2P bus apparatus 32 including a number of peer devices 34(1)-34(N) each configured to contend for an opportunity to initiate communication over a single-wire bus 36. In a non-limiting example, the single-wire bus 36, which consists of a single wire, is identical to the SuBUS 16 in FIG. 1A. In examples discussed herein, the peer devices 34(1)-34(M) are assigned a number of bus access priorities $P_1$-$P_N$, respectively, with $P_1$ being the highest bus access priority and $P_N$ being the lowest bus access priority ($P_1 > P_2 > P_3 > \ldots > P_N$). In this regard, the peer device 34(1) is assigned the highest bus access priority $P_1$ and referred to as "a first peer device" hereinafter. The peer devices 34(2)-34(N) are associated with descending bus access priorities $P_2$-$P_N$, respectively. Hereinafter, the peer devices 34(2)-34(N) are collectively referred to as "at least one second peer device" and the bus access priorities $P_2$-$P_N$ are collectively referred to as "at least one second bus access priority."

As discussed in detail below, one or more selected peer devices among the peer devices 34(1)-34(N) may assert a bus contention indication(s) when the single-wire bus 36 is in a defined bus state (e.g., the fast-charge state and/or the idle state) configured to permit bus contention. However, only one of the selected peer devices (also referred to as "bus winning peer device") with a highest bus access priority can gain access to the single-wire bus 36 to initiate telegram communication over the single-wire bus 36. For example, if peer devices 34(1), 34(3), and 34(N), which are associated respectively with the bus access priorities $P_1$, $P_3$, and $P_N$, all assert the bus contention indication when the single-wire bus 36 is in the defined bus state, only the peer device 34(1) can gain access to the single-wire bus 36 as a result of the highest bus access priority $P_1$. Accordingly, the bus-winning peer device 34(1) can initiate the telegram communication with the peer devices 34(3) and 34(N) over the single-wire bus 36.

By allowing the peer devices 34(1)-34(N) to contend for access to the single-wire bus 36 based on respectively assigned bus access priorities $P_1$-$P_N$, it may be possible for any of the peer devices 34(1)-34(N) to initiate the telegram communication over the single-wire bus 36. As a result, it may be possible for the single-wire bus 36 to function based on a P2P bus architecture, as opposed to the conventional master-slave bus architecture 10 of FIG. 1A, to support more application and/or deployment scenarios.

Figure 3A:
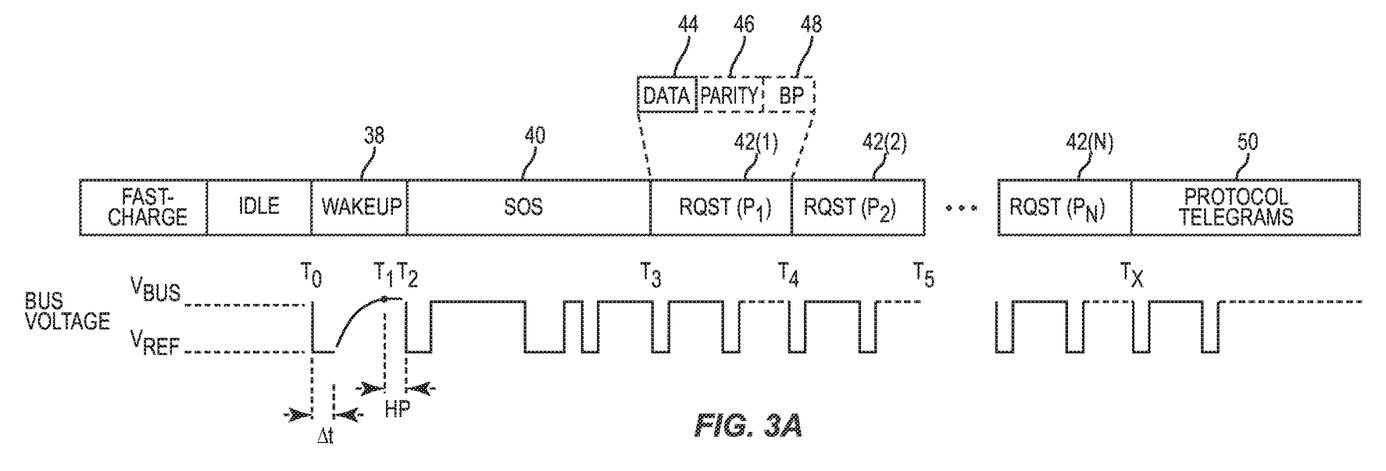
FIG. 3A is a time sequence diagram providing an exemplary illustration of one embodiment of a single-wire P2P bus contention and arbitration mechanism that enables the peer devices to contend for access to the single-wire bus of FIG. 2 based on respective bus access priorities.
Figure 3B:
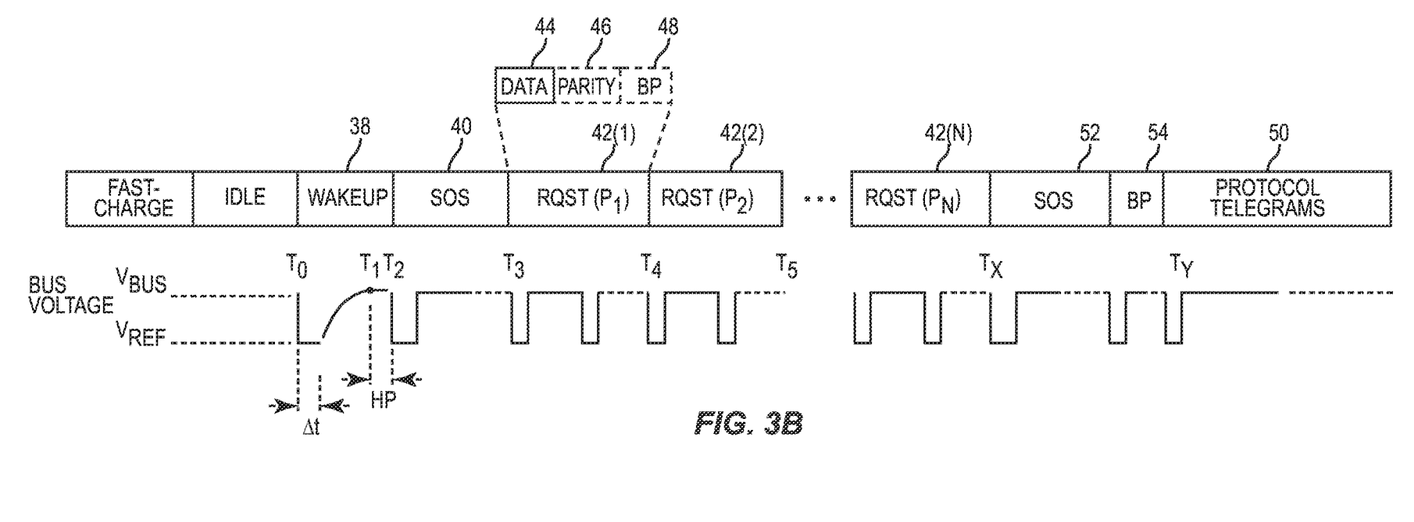
FIG. 3B is a time sequence diagram providing an exemplary illustration of another embodiment of a single-wire P2P bus contention and arbitration mechanism that enables the peer devices to contend for access to the single-wire bus of FIG. 2 based on respective bus access priorities.

To help understand a single-wire P2P bus contention and arbitration mechanism employed by the single-wire P2P bus apparatus 32 that allows the peer devices 34(1)-34(N) to contend for access to the single-wire bus 36 based on the assigned bus access priorities $P_1$-$P_N$, FIGS. 3A and 3B are discussed below as non-limiting examples. Common elements between FIGS. 2, 3A, and 3B are shown therein with common element numbers and will not be re-described herein.

In this regard, FIG. 3A is a time sequence diagram providing an exemplary illustration of one embodiment of the single-wire P2P bus contention and arbitration mechanism that enables the peer devices 34(1)-34(N) to contend for access to the single-wire bus 36 of FIG. 2 based on respective bus access priorities $P_1$-$P_N$. Notably, the peer devices 34(1)-34(N) are only allowed to contend for access to the single-wire bus 36 when the single-wire bus 36 is in the defined bus state, such as the idle state. As such, each of the peer devices 34(1)-34(N) may be required to monitor the single-wire bus 36 (e.g., by monitoring the idle period 30 in FIG. 1B) to determine whether the single-wire bus 36 is in the defined bus state. As mentioned earlier in FIG. 1B, the single-wire bus 36 is maintained at the bus voltage $V_{BUS}$ ($V_{BUS} > 0$ V). As such, the peer devices 34(1)-34(N) may be configured to monitor the bus voltage $V_{BUS}$ to determine whether the single-wire bus 36 is in the defined bus state.

As illustrated in FIG. 3A, the single-wire bus 36 is in either the fast charge state or the idle state prior to time $T_0$. If the single-wire bus 36 is in the fast-charge state, the peer device 34(1) (the first peer device) can be configured to provide a charging current to the peer devices 34(2)-34(N) (collectively the at least one second peer device). For more detail on how the first peer device 34(1) provides the charging current to any of the peer devices 34(2)-34(N) during the fast-charge state, please refer to FIG. 3 of U.S. patent application Ser. No. 16/549,116, entitled "SINGLE-WIRE BUS APPARATUS" and filed on Aug. 23, 2019. Notably, when the single-wire bus 36 is in the fast charge state, all of the peer devices 34(1)-34(N) are configured to refrain from communicating telegrams and data payloads over the single-wire bus 36. If the single-wire bus 36 is in the idle state, the single-wire bus 36 is maintained at the bus voltage $V_{BUS}$. Accordingly, the peer devices 34(1)-34(N) may communicate among each other over the single-wire bus 36. In this regard, the idle state can correspond to the defined bus state configured to permit bus contention by any of the peer devices 34(1)-34(N).

At time $T_0$, at least one selected peer device among the peer devices 34(1)-34(N) asserts a bus contention indication to indicate an intent to access the single-wire bus 36. Accordingly, the single-wire bus 36 is said to be in a wakeup period 38. In a non-limiting example, the selected peer device can assert the bus contention indication by pulling the bus voltage $V_{BUS}$ of the single-wire bus 36 to a predefined threshold $V_{REF}$ (0 V≤$V_{REF}$<$V_{BUS}$) and subsequently restore the single-wire bus 36 to the bus voltage $V_{BUS}$.

Given that all of the peer devices 34(1)-34(N) may be monitoring the bus voltage $V_{BUS}$ of the single-wire bus 36, the peer devices 34(1)-34(N) would all be able to learn that a peer device(s) has asserted the bus contention indication in response to the single-wire bus 36 being pulled from the bus voltage $V_{BUS}$ down to the predefined threshold $V_{REF}$. As such, it may not be necessary for another peer device among the peer devices 34(1)-34(N) to assert its own bus contention indication. However, it should be appreciated that all of the peer devices 34(1)-34(N) may still assert respective bus contention indications concurrent to or independent from the selected peer device.

The single-wire bus 36 may not return to the bus voltage $V_{BUS}$ if any of the peer devices 34(1)-34(N) is asserting the bus contention indication. As such, the single-wire bus 36 may be held at the predefined threshold $V_{REF}$ for a period Δt before returning to the bus voltage $V_{BUS}$. Notably, the single-wire bus 36 may not be able to climb back to the bus voltage $V_{BUS}$ immediately due to inherent ramp-up delay. For example, the single-wire bus 36 may not return to the bus voltage $V_{BUS}$ until time $T_1$.

The first peer device 34(1), which has the highest bus access priority $P_1$, may be configured to immediately end the wakeup period 38 by broadcasting an opening SOS sequence 40 over the single-wire bus 36 at time $T_1$. In this regard, the opening SOS sequence 40 is broadcasted over the single-wire bus 36 between time $T_1$ and $T_3$. Alternatively, the first peer device 34(1) may also be configured to end the wakeup period 38 after a hysteresis period HP (e.g., one symbol) from time $T_1$ by broadcasting the opening SOS sequence 40 over the single-wire bus 36 at time $T_2$ (HP=$T_2$–$T_1$). In this regard, the opening SOS sequence 40 is broadcasted over the single-wire bus 36 between time $T_2$ and $T_3$. The opening SOS sequence 40 may be configured to start telegram communication over the single-wire bus 36 and provide a timing reference for the second peer devices 34(2)-34(N) on the single-wire bus 36.

Starting at time $T_3$, the peer devices 34(1)-34(N) are configured to broadcast a number of bus request telegrams 42(1)-42(N), respectively, in a sequential order determined by the bus access priorities $P_1$-$P_N$. In this regard, the first peer device 34(1) first starts broadcasting the bus request telegram 42(1) (also referred to as "first bus request telegram") at time $T_3$. Subsequently, the second peer devices 34(2)-34(N) broadcast the bus request telegrams 42(2)-42(N) (collectively referred to as "at least one second bus request telegram") sequentially based on the bus access priorities $P_2$-$P_N$.

Each of the bus request telegrams 42(1)-42(N) includes a data field 44 configured to indicate a respective intention to access the single-wire bus 36, regardless of whether the respective peer device 34(1)-34(N) has asserted the bus contention intention during the wakeup period 38. For example, one of the peer devices 34(1)-34(N) may have asserted the bus contention intention during the wakeup period 38. The peer device 34(3) detected the asserted bus contention intention by monitoring the bus voltage $V_{BUS}$. As a result, the peer device 34(3) may have decided to forego the opportunity to assert its own bus contention indication, even though the peer device 34(3) also has an intention to access the single-wire bus 36. Nevertheless, the peer device 34(3) may still signal the intention to access the single-wire bus 36 in the data field 44 of the bus request telegram 42(3).

In addition to the data field 44, each of the bus request telegrams 42(1)-42(N) may also include a respective parity field 46 succeeding the data field 44. Each of the bus request telegrams 42(1)-42(N) may further include a respective bus park (BP) field 48 succeeding the parity field 46. In a non-limiting example, the bus request telegrams 42(1)-42(N) are configured to have an identical duration (e.g., three symbols).

Each of the peer devices 34(1)-34(N) may be configured to monitor and/or decode all of the bus request telegrams 42(1)-42(N) to help determine whether any peer device 34(1)-34(N) with a higher bus access priority has requested access the single-wire bus 36. Accordingly, any peer device 34(1)-34(N) with a lower bus access priority is required to refrain from initiating telegram communication over the single-wire bus 36. For example, if the first peer device 34(1) has indicated in the data field 44 of the bus request telegram 42(1) an intention to access the single-wire bus 36, the first peer device 34(1) will become the bus-winning peer device due to the highest bus access priority $P_1$. As a result, all of the second peer devices 34(2)-34(N) are required to refrain from initiating telegram communication over the single-wire bus 36. As such, it may be possible to avoid potential bus collision based on such self-disciplinary arbitration mechanism.

At time $T_X$, the peer devices 34(1)-34(N) have completed broadcasting the bus request telegrams 42(1)-42(N), respectively. In a non-limiting example, each of the peer devices 34(1)-34(N) can determine time $T_X$ based on the equation (Eq. 1) below.

$$T_X = T_3 + N*D_{RQST} \qquad (Eq. 1)$$

In the equation above, N represents a count of the peer devices 34(1)-34(N) and $D_{RQST}$ represents a duration of each of the bus request telegrams 42(1)-42(N). Accordingly, the bus winning peer device can start communicating one or more protocol telegrams 50 at time $T_X$.

After the bus winning peer device completes communicating the protocol telegrams 50, the single-wire bus 36 returns to the fast-charge state and the idle state. In this regard, any of the peer devices 34(1)-34(N) may start asserting the bus contention indication again as described above.

FIG. 3B is a time sequence diagram providing an exemplary illustration of another embodiment of the single-wire P2P bus contention and arbitration mechanism that enables the peer devices 34(1)-34(N) to contend for access to the single-wire bus 36 of FIG. 2 based on respective bus access priorities $P_1$-$P_N$.

In this embodiment, only the first peer device 34(1) is configured to determine time $T_X$ based on the equation (Eq. 1). At time $T_X$, the first peer device 34(1) is configured to broadcast a closing SOS sequence 52, which can be identical to or different from the opening SOS sequence 40. The first peer device 34(1) may be further configured to broadcast a BP sequence 54 subsequent to broadcasting the closing SOS sequence 52. The BP sequence 54 is configured to provide an explicit indication of time $T_Y$ at which the bus winning peer device can start communicating the protocol telegrams 50.

Figure 4:
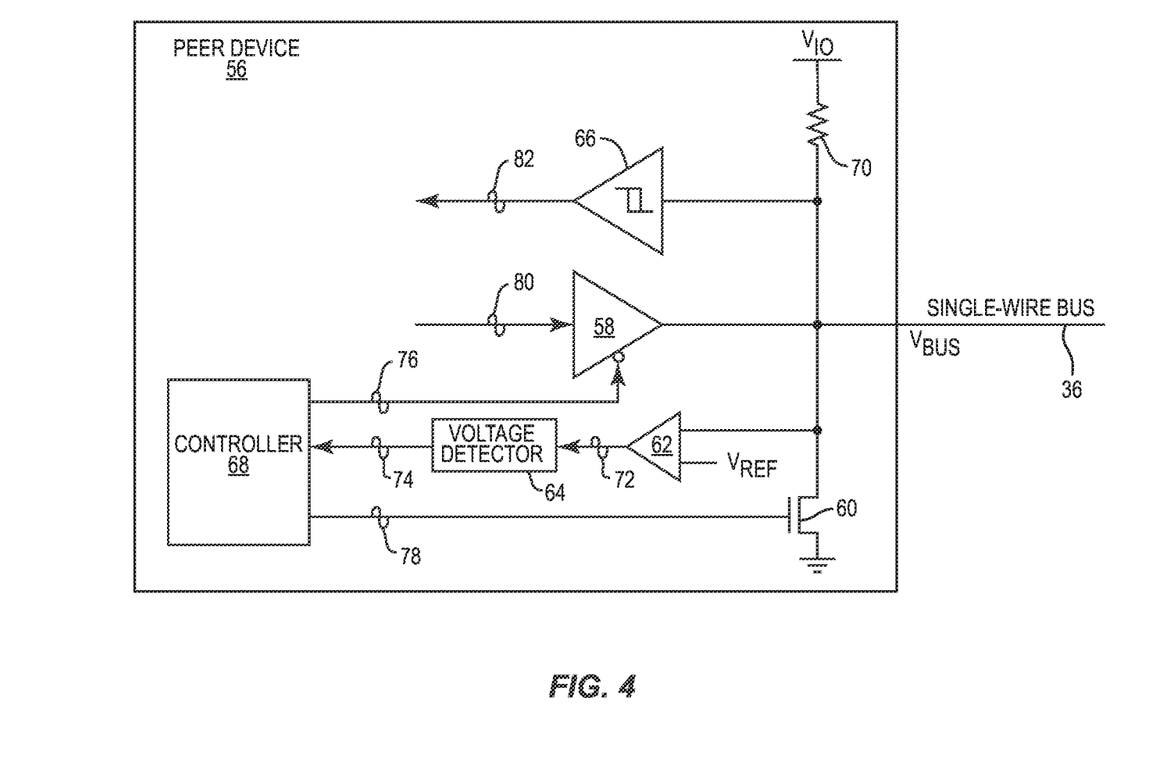
FIG. 4 is a schematic diagram of an exemplary peer device, which can be provided in the single-wire P2P bus apparatus of FIG. 2 as any of the peer devices.

FIG. 4 is a schematic diagram of an exemplary peer device 56, which can be provided in the single-wire P2P bus apparatus 32 of FIG. 2 as any of the peer devices 34(1)-34

(N). Common elements between FIGS. 2 and 4 are shown therein with common element numbers and will not be re-described herein.

In a non-limiting example, the peer device 56 includes a push/pull (PP) driver 58, an open-drain (OD) driver 60, a voltage comparator 62, a voltage detector 64, and a data receiver 66 (e.g., an input Schmitt). The peer device 56 may also include a controller 68, which can be implemented by a microprocessor, a microcontroller, or a field-programmable gate array (FPGA), as an example.

When the single-wire bus 36 is in the idle state, a resistor 70 causes the bus voltage $V_{BUS}$ of the single-wire bus 36 to be substantially close to a supply voltage $V_{IO}$ (e.g., $V_{IO}-V_{BUS} \leq 70$ mV). The voltage comparator 62 compares the bus voltage $V_{BUS}$ against the predefined threshold $V_{REF}$ and provides a comparison result 72 to the voltage detector 64. Based on the comparison result 72, the voltage detector 64 determines that the bus voltage $V_{BUS}$ is higher than the predefined threshold $V_{REF}$ and provides an indication 74 to the controller 68. Accordingly, the controller 68 places the PP driver 58 in a tri-stated mode by asserting a PP control signal 76 (e.g., as a logical HIGH). To assert a bus contention intention when the single-wire bus 36 is in the idle state, the controller 68 can activate the OD driver 60 by asserting a bus contention control signal 78 (e.g., as a logical HIGH) to pull the bus voltage $V_{BUS}$ down to the predefined threshold $V_{REF}$, while keeping the PP driver 58 in the tri-stated mode.

Again, the voltage comparator 62 compares the bus voltage $V_{BUS}$ against the predefined threshold $V_{REF}$ and provides the comparison result 72 to the voltage detector 64. Based on the comparison result 72, the voltage detector 64 determines that the bus voltage $V_{BUS}$ is lower than or equal to the predefined threshold $V_{REF}$ and provides the indication 74 to the controller 68. Accordingly, the controller 68 may deactivate the OD driver 60 by de-asserting the bus contention control signal 78 (e.g., as a logical LOW). As a result, the resistor 70 may cause the single-wire bus 36 to return to the bus voltage $V_{BUS}$.

The peer device 56 may determine whether the bus contention indication is successful based on the single-wire P2P bus contention and arbitration mechanism as discussed in FIGS. 3A and 3B. If the peer device 56 determines that the bus contention indication is successful, the controller 68 may de-assert the PP control signal 76 (e.g., as a logical LOW) to put the PP driver 58 out of the tri-stated mode. Accordingly, the peer device 56 may communicate a command telegram(s) 80 via the PP driver 58 and/or receive a data payload(s) 82 via the data receiver 66. In a non-limiting example, the controller 68 is configured to de-assert the bus contention control signal 78 prior to de-asserting the PP control signal 76.

In contrast, if the peer device 56 determines that the bus contention indication is unsuccessful, the controller 68 may maintain the PP control signal 76 (e.g., at logical HIGH) to block the command telegram(s) 80 from the single-wire bus 36. The peer device 56 may attempt to re-assert the bus contention indication when the single-wire bus 36 returns to the defined bus state.

Figure 5:
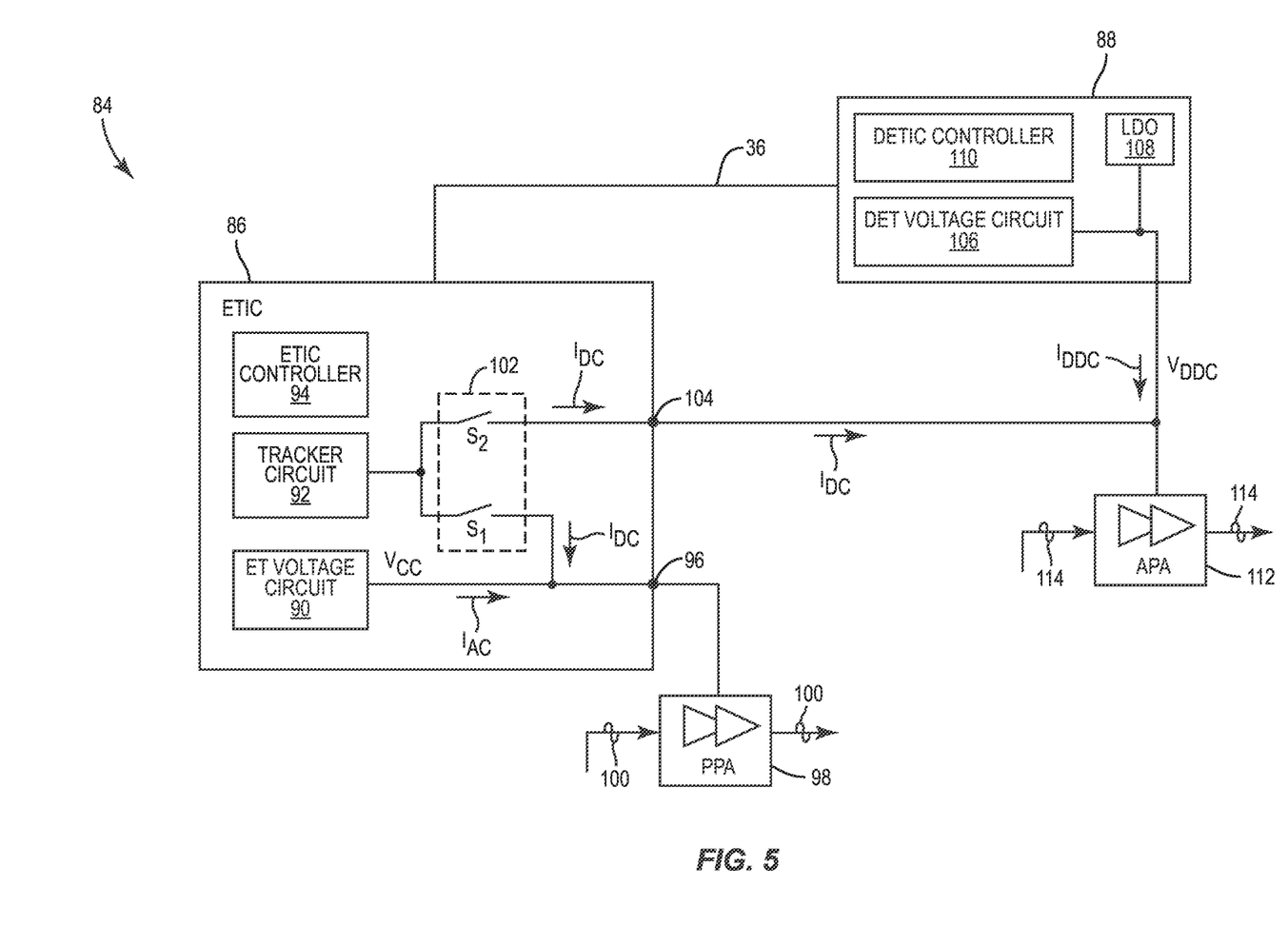
FIG. 5 is a schematic diagram of an exemplary envelope tracking (ET) amplifier apparatus configured to incorporate the single-wire P2P bus apparatus of FIG. 2 to support P2P communications between chips and/or circuits.

The single-wire P2P bus apparatus 32 of FIG. 2 can be provided in an envelope tracking (ET) amplifier apparatus to enable P2P communications between chips and/or circuits. In this regard, FIG. 5 is a schematic diagram of an exemplary ET amplifier apparatus 84 configured to incorporate the single-wire P2P bus apparatus 32 of FIG. 2. Common elements between FIGS. 2 and 5 are shown therein with common element numbers and will not be re-described herein.

The ET amplifier apparatus 84 includes an ET integrated circuit (ETIC) 86 and a distributed ETIC (DETIC) 88. In a non-limiting example, the ETIC 86 and the DETIC 88 are provided in different dies, such as system-on-chips (SOCs), physically separated from each other. The ETIC 86 includes an ET voltage circuit 90, a tracker circuit 92, and an ETIC controller 94, which can be a microprocessor, a microcontroller, or a FPGA, as an example.

The ETIC 86 includes a primary output port 96 coupled to a primary amplifier circuit 98 (denoted as "PPA") configured to amplify a primary radio frequency (RF) signal 100 based on an ET modulated voltage $V_{CC}$. In a non-limiting example, the primary RF signal 100 is a cellular communication signal, such as a long-term evolution (LTE) or a fifth-generation new-radio (5G-NR) communication signal.

The ET voltage circuit 90 is configured to generate and provide the ET modulated voltage $V_{CC}$ to the primary output port 96. Notably, the primary RF signal 100 may be modulated in a wide range of modulation bandwidths and correspond to a variety of peak-to-average ratios (PARs). As such, the ET voltage circuit 90 may also need to source/sink a high-frequency current $I_{AC}$ (e.g., an alternating current) to/from the primary output port 96.

The tracker circuit 92 is configured to generate a low-frequency current $I_{DC}$ (e.g., a direct current). The ETIC 86 may include a switching circuit 102 coupled to the tracker circuit 92, the primary output port 96, and an auxiliary output port 104. The switching circuit 102 may include a first switch $S_1$ and a second switch $S_2$, which can be controlled by the ETIC controller 94 to selectively provide the low-frequency current $I_{DC}$ to the primary output port 96 or the auxiliary output port 104.

The DETIC 88 includes a distributed ET (DET) voltage circuit 106, a low dropout (LDO) regulator 108 (denoted as "LDO"), and a DETIC controller 110, which can be a microprocessor, a microcontroller, or a FPGA, as an example. The DETIC 88 is coupled to an auxiliary amplifier circuit 112 (denoted as "APA") configured to amplify an auxiliary RF signal 114 based on a DET modulated voltage $V_{DCC}$. In a non-limiting example, the auxiliary RF signal 114 is a Wi-Fi communication signal.

The DET voltage circuit 106 is configured to generate and provide the DET modulated voltage $V_{DCC}$ to the auxiliary amplifier circuit 112 for amplifying the auxiliary RF signal 114. The auxiliary amplifier circuit 112 may be selectively coupled to the auxiliary output port 104 to receive the low-frequency current $I_{DC}$ from the tracker circuit 92 or to the LDO regulator 108 to receive a distributed low-frequency current $I_{DDC}$.

The ETIC 86 is coupled to the DETIC 88 via the single-wire bus 36. In examples discussed herein, the ETIC 86 and the DETIC 88 are associated with bus access priorities $P_1$ and $P_2$ ($P_1 > P_2$), respectively. In this regard, the ETIC 86 may correspond to the first peer device 34(1) and the DETIC 88 may correspond to one of the second peer devices 34(2)-34(N), as previously described in FIG. 2.

In one non-limiting example, the DETIC 88 can assert a bus contention indication when the single-wire bus 36 is in the defined bus state. If the bus contention indication is successful, the DETIC 88 may communicate the protocol telegrams 50 to the ETIC 86 to request to draw the low-frequency current $I_{DC}$ from the tracker circuit 92. Upon receiving the protocol telegrams 50 from the DETIC 88, the ETIC controller 94 may determine whether the primary amplifier circuit 98 is active to amplify the primary RF signal 100. If the primary amplifier circuit 98 is active, the ETIC controller 94 may decline the request from the DETIC 88. Otherwise, the ETIC controller 94 may close the second switch S$_2$ and open the first switch S$_1$ such that the auxiliary amplifier circuit 112 can draw the low-frequency I$_{DC}$ from the tracker circuit 92. Accordingly, the DETIC controller 110 may deactivate the LDO regulator 108 in the DETIC 88.

When the DETIC controller 110 determines that the auxiliary amplifier circuit 112 has completed amplifying the auxiliary RF signal 114, the DETIC controller 110 may assert the bus contention indication when the single-wire bus 36 is once again in the defined bus state. If the bus contention indication is successful, the DETIC controller 110 may communicate the protocol telegrams 50 to cause the ETIC controller 94 to decouple the auxiliary output port 104 from the auxiliary amplifier circuit 112.

In case the ETIC controller 94 declines the request by the DETIC 88 to draw the low-frequency current I$_{DC}$ from the tracker circuit 92, the DETIC controller 110 may activate the LDO regulator 108 to provide the distributed low-frequency current I$_{DDC}$ to the auxiliary amplifier circuit 112. The DETIC controller 110 may attempt to assert the bus contention indication again when the single-wire bus 36 is once again in the defined bus state.

In another non-limiting example, the ETIC controller 94 determines that the primary amplifier circuit 98 becomes active to amplify the primary RF signal 100 and thus in need of the low-frequency current I$_{DC}$, while the auxiliary amplifier circuit 112 is still drawing the low-frequency current I$_{DC}$ from the tracker circuit 92. In this regard, the ETIC controller 94 needs to wait until the single-wire bus 36 is in the defined bus state to assert a bus contention indication. Given that the ETIC 86 is associated with the higher bus access priority F$_1$, the ETIC controller 94 would become the bus winning peer device after asserting the bus contention indication. Accordingly, the ETIC controller 94 may communicate the protocol telegrams 50 to the DETIC 88 to inform the DETIC controller 110 that the ETIC 86 is in need of the tracker circuit 92. Accordingly, the DETIC controller 110 may activate the LDO regulator 108 to provide the distributed low-frequency current I$_{DDC}$ to the auxiliary amplifier circuit 112. Subsequently, the DETIC controller 110 may inform the ETIC controller 94 to decouple the tracker circuit 92 from the auxiliary amplifier circuit 112. Accordingly, the ETIC controller 94 opens the second switch S$_2$ and closes the first switch S$_1$ to provide the low-frequency current I$_{DC}$ to the primary amplifier circuit 98.

Those skilled in the art will recognize improvements and modifications to the embodiments of the present disclosure. All such improvements and modifications are considered within the scope of the concepts disclosed herein and the claims that follow.

What is claimed is:

1. A single-wire peer-to-peer (P2P) bus apparatus comprising:
    a first peer device coupled to a single-wire bus and assigned a first bus access priority, the first peer device is configured to broadcast an opening start-of-sequence (SOS) sequence configured to start telegram communication and provide a timing reference for at least one second peer device; and
    the at least one second peer device coupled to the single-wire bus and assigned at least one second bus access priority lower than the first bus access priority;
    wherein at least one selected peer device among the first peer device and the at least one second peer device is configured to:
        assert a bus contention indication when the single-wire bus is in a defined bus state configured to permit bus contention;
        determine whether the bus contention indication is successful based on the first bus access priority of the first peer device and the at least one second bus access priority of the at least one second peer device; and
        communicate over the single-wire bus in response to the bus contention indication being successful.

2. The single-wire P2P bus apparatus of claim 1 further comprising the single-wire bus.

3. The single-wire P2P bus apparatus of claim 1 wherein the defined bus state corresponds to an idle state configured to enable communication between the first peer device and the at least one second peer device.

4. The single-wire P2P bus apparatus of claim 1 wherein the single-wire bus is maintained at a bus voltage during the defined bus state.

5. The single-wire P2P bus apparatus of claim 4 wherein the at least one selected peer device is further configured to assert the bus contention indication by pulling down the bus voltage of the single-wire bus to a predefined threshold and subsequently restoring the single-wire bus to the bus voltage.

6. The single-wire P2P bus apparatus of claim 5 wherein the first peer device is further configured to broadcast the opening SOS sequence immediately upon the at least one selected peer device restoring the single-wire bus to the bus voltage.

7. The single-wire P2P bus apparatus of claim 5 wherein the first peer device is further configured to broadcast the opening SOS sequence after a hysteresis period from a time at which the at least one selected peer device restores the single-wire bus to the bus voltage.

8. The single-wire P2P bus apparatus of claim 5 wherein the first peer device is further configured to broadcast a first bus request telegram over the single-wire bus immediately after communicating the opening SOS sequence.

9. The single-wire P2P bus apparatus of claim 8 wherein the at least one second peer device is configured to broadcast at least one second bus request telegram over the single-wire bus immediately after the first peer device broadcasts the first bus request telegram.

10. The single-wire P2P bus apparatus of claim 9 wherein the first peer device and the at least one second peer device are configured to broadcast the first bus request telegram and the at least one second bus request telegram, respectively, according to an order established by the first bus access priority and the at least one second bus access priority.

11. The single-wire P2P bus apparatus of claim 9 wherein each of the first bus request telegram and the at least one second bus request telegram comprises a respective data field configured to indicate a respective intention to access the single-wire bus.

12. The single-wire P2P bus apparatus of claim 11 wherein each of the first bus request telegram and the at least one second bus request telegram further comprises a respective parity field subsequent to the respective data field.

13. The single-wire P2P bus apparatus of claim 12 wherein each of the first bus request telegram and the at least one second bus request telegram further comprises a respective bus park field subsequent to the respective parity field.

14. The single-wire P2P bus apparatus of claim 9 wherein the at least one selected peer device is further configured to:
- determine an end of the at least one second bus request telegram; and
- communicate one or more protocol telegrams subsequent to the end of the at least one second bus request telegram in response to the bus contention indication being successful.

15. The single-wire P2P bus apparatus of claim 9 wherein the first peer device is further configured to broadcast a closing SOS sequence subsequent to the at least one second bus request telegram.

16. The single-wire P2P bus apparatus of claim 15 wherein the opening SOS sequence is configured to be identical to the closing SOS sequence.

17. The single-wire P2P bus apparatus of claim 15 wherein the opening SOS sequence is configured to be different from the closing SOS sequence.

18. The single-wire P2P bus apparatus of claim 15 wherein the first peer device is further configured to broadcast a bus park sequence subsequent to the closing SOS sequence.

19. The single-wire P2P bus apparatus of claim 18 wherein the at least one selected peer device is further configured to communicate one or more protocol telegrams subsequent to the bus park sequence in response to the bus contention indication being successful.

\* \* \* \* \*